United States Patent
Dekker et al.

(10) Patent No.: US 10,634,698 B2
(45) Date of Patent: Apr. 28, 2020

(54) HIGH-PRECISION SCANNING DEVICE

(71) Applicant: Nederlandse Organisatie voor toegepast-natuurwetenschappelijk onderzoek TNO, s-Gravenhage (NL)

(72) Inventors: Albert Dekker, Delft (NL); Anton Adriaan Bijnagte, Tricht (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 16/461,877

(22) PCT Filed: Nov. 17, 2017

(86) PCT No.: PCT/NL2017/050749
§ 371 (c)(1),
(2) Date: May 17, 2019

(87) PCT Pub. No.: WO2018/093262
PCT Pub. Date: May 24, 2018

(65) Prior Publication Data
US 2019/0353679 A1    Nov. 21, 2019

(30) Foreign Application Priority Data

Nov. 18, 2016  (EP) .................................... 16199624

(51) Int. Cl.
*G01Q 10/06* (2010.01)
*H01J 37/20* (2006.01)

(52) U.S. Cl.
CPC ............ *G01Q 10/065* (2013.01); *H01J 37/20* (2013.01); *H01J 2237/20264* (2013.01)

(58) Field of Classification Search
CPC .................... G01Q 10/065; H01J 37/20; H01J 2237/20264
See application file for complete search history.

(56) References Cited

U.S. PATENT DOCUMENTS

| 2005/0231066 A1 | 10/2005 | Iyoki et al. |
| 2011/0107471 A1 | 5/2011 | Masser |

FOREIGN PATENT DOCUMENTS

EP        0871166 A1    10/1998

OTHER PUBLICATIONS

Apr. 6, 2018—PCT/NL2017/050749 ISR & WO.

*Primary Examiner* — Nicole M Ippolito
*Assistant Examiner* — Hanway Chang
(74) *Attorney, Agent, or Firm* — Banner & Witcoff, Ltd.

(57) ABSTRACT

A high-precision scanning device (1) comprises a first linear scanner (11) for providing scanning movements along a first linear scanning axis (21). The first linear scanner comprises a first base frame (31), a first scanning frame (41), two mutually parallel first piezoelectric bending plates (51A, 51B), and two first hinge joints (61A, 61B) having two first hinge axes (71A, 71B), respectively. Under influence of synchronic piezoelectric operation of the two first piezoelectric bending plates, the first scanning frame is being synchronically moved relative to the first base frame along said first linear scanning axis. The scanning device is compact, especially nearby the working areas where the precise scanning movements have to be performed, so that the device can be operable in very tiny working areas.

6 Claims, 6 Drawing Sheets

HIGH-PRECISION SCANNING DEVICE

CROSS-REFERENCE TO RELATED APPLICATIONS

This application is a U.S. National Stage application under 35 U.S.C. § 371 of International Application PCT/NL2017/050749 (published as WO 2018/093262 A1), filed Nov. 17, 2017, which claims the benefit of priority to Application EP 16199624.4, filed Nov. 18, 2016. Each of these prior applications is hereby incorporated by reference in its entirety.

The invention relates to a high-precision scanning device, which is configured for providing precise scanning movements over relatively short distances, typically in the range of up to a few hundred micrometers as an order of magnitude, and with high levels of positioning accuracy, typically down to 1 micrometer or less. These high-precision scanning devices are for example used for sample handling in (electron) optical microscopes or atomic force microscopes, for precision motions in semiconductor equipment, or for various other kinds of microhandling.

It is an object of the invention to provide a high-precision scanning device of the abovementioned type, in such manner that the scanning device is compact, especially nearby the working areas where the precise scanning movements have to be performed, so that the device can be operable in very tiny working areas.

For that purpose the invention provides a high-precision scanning device according to the attached independent claim 1. Preferable embodiments of the invention are provided by the attached dependent claims 2-6.

Hence the invention provides a high-precision scanning device comprising:

a first linear scanner for providing scanning movements along a first linear scanning axis, wherein said first linear scanner comprises a first base frame, a first scanning frame, two mutually parallel first piezoelectric bending plates, and two first hinge joints having two mutually parallel first hinge axes, respectively, and wherein:

said first linear scanning axis is orthogonal to said first piezoelectric bending plates as seen in unbent, straight conditions of said first piezoelectric bending plates;

said two mutually parallel first hinge axes are parallel to local bending axes about which said first piezoelectric bending plates are locally bending when piezoelectrically operated;

the two first piezoelectric bending plates have two mutually parallel first immovable plate portions, respectively, which are immoveably connected relative to the first base frame;

the two first piezoelectric bending plates have two mutually parallel first moveable plate portions, respectively, which are moveable relative to the first base frame in accordance with said locally bending of said first piezoelectric bending plates;

the two first hinge joints are hingingly connecting the first scanning frame to the two first moveable plate portions, respectively, whereby the first scanning frame is forming a hingeable bridge between the two first piezoelectric bending plates;

under influence of synchronic piezoelectric operation of the two first piezoelectric bending plates, the two first moveable plate portions together with the first scanning frame are being synchronically moved relative to the first base frame along said first linear scanning axis, while at the same time the two first immovable plate portions remain immoveably connected relative to the first base frame.

Hence, according to the invention, the pair of mutually parallel first piezoelectric bending plates provides an effective dual function. That is, said pair of parallel bending plates not only provides the guidance of the first scanning frame along the first linear scanning axis, but at the same time also provides the piezoelectric actuation of the first scanning frame. Thanks to this dual function of guidance and actuation the high-precision scanning device according to the invention can be compact, especially nearby the working areas where the precise scanning movements have to be performed, so that the device can be operable in very tiny working areas.

In a preferable embodiment of a high-precision scanning device according to the invention, the high-precision scanning device further comprises:

at least one first sensor, which is configured, arranged and effective to detect first real-time conditions of the first linear scanner, wherein first real-time positions of the first scanning frame along said first linear scanning axis are obtainable from said detected first real-time conditions; and at least one first feedback controller, which is configured, arranged and effective for feedback control of said synchronic piezoelectric operation of the two first piezoelectric bending plates for realizing first imposed positions of the first scanning frame along said first linear scanning axis based on said detected first real-time conditions.

Said feedback control provided by the at least one first sensor and the at least one first feedback controller, especially in view of its use in combination with the two first piezoelectric bending plates, is highly efficient for achieving high precision of the scanning device along the first linear scanning axis.

In another preferable embodiment of a high-precision scanning device according to the invention, the high-precision scanning device further comprises:

a second linear scanner for providing scanning movements along a second linear scanning axis, wherein said second linear scanner comprises a second base frame, a second scanning frame, two mutually parallel second piezoelectric bending plates, and two second hinge joints having two mutually parallel second hinge axes, respectively, and wherein:

said second linear scanning axis is orthogonal to said second piezoelectric bending plates as seen in unbent, straight conditions of said second piezoelectric bending plates;

said two mutually parallel second hinge axes are parallel to local bending axes about which said second piezoelectric bending plates are locally bending when piezoelectrically operated;

the two second piezoelectric bending plates have two mutually parallel second immovable plate portions, respectively, which are immoveably connected relative to the second base frame;

the two second piezoelectric bending plates have two mutually parallel second moveable plate portions, respectively, which are moveable relative to the second base frame in accordance with said locally bending of said second piezoelectric bending plates;

the two second hinge joints are hingingly connecting the second scanning frame to the two second moveable plate portions, respectively, whereby the second scanning frame is forming a hingeable bridge between the two second piezoelectric bending plates;

under influence of synchronic piezoelectric operation of the two second piezoelectric bending plates, the two second moveable plate portions together with the second scanning frame are being synchronically moved relative to the second base frame along said second linear scanning axis, while at the same time the two second immovable plate portions remain immoveably connected relative to the second base frame;

and wherein:

the first linear scanning axis and the second linear scanning axis are non-parallel relative to one another;

the two mutually parallel second immovable plate portions are immoveably connected relative to the first scanning frame.

Hence in this preferable embodiment the pair of second piezoelectric bending plates of the second linear scanner provides a similar effective dual function (guidance and actuation) as provided by the pair of first piezoelectric bending plates of the first linear scanner. Furthermore, since in this preferable embodiment the two second immovable plate portions are immoveably connected relative to the first scanning frame, and since the first linear scanning axis and the second linear scanning axis are non-parallel relative to one another, the second scanning frame functions as the overall scanning frame of the high-precision scanning device for the two-dimensional scanning movements along the first and second linear scanning axes. Accordingly, said dual functions of the first and second linear scanners provide a synergistical effect as to the compactness of the high-precision scanning device, especially nearby the working areas where the precise two-dimensional scanning movements have to be performed.

Preferably, the first linear scanning axis and the second linear scanning axis are orthogonal relative to one another.

Another preferable embodiment of a high-precision scanning device according to the invention has the further features that, as seen along a third axis which is orthogonal to both the first linear scanning axis and the second linear scanning axis, a first direction facing from the first base frame towards the first scanning frame is opposite to a second direction facing from the second base frame towards the second scanning frame.

Thanks to said first and second directions being opposite to one another the high-precision scanning device with its first and second linear scanners can be designed with a very high overall compactness, which further improves the accessibility of the high-precision scanning device to very tiny working areas where the precise two-dimensional scanning movements have to be performed.

In another preferable embodiment of a high-precision scanning device according to the invention, the high-precision scanning device further comprises:

at least one second sensor, which is configured, arranged and effective to detect second real-time conditions of the second linear scanner, wherein second real-time positions of the second scanning frame along said second linear scanning axis are obtainable from said detected second real-time conditions; and at least one second feedback controller, which is configured, arranged and effective for feedback control of said synchronic piezoelectric operation of the two second piezoelectric bending plates for realizing second imposed positions of the second scanning frame along said second linear scanning axis based on said detected second real-time conditions.

Said feedback control provided by the at least one second sensor and the at least one second feedback controller, especially in view of its use in combination with the two second piezoelectric bending plates, is highly efficient for achieving high precision of the scanning device along the second linear scanning axis.

In the following, the invention is further elucidated with reference to non-limiting embodiments and with reference to the schematic figures in the attached drawing, in which the following is shown.

The reference signs used in FIGS. 1-6 are referring to the abovementioned parts and aspects of the invention, as well as to related parts and aspects, in the following manner.

Figure 1A:
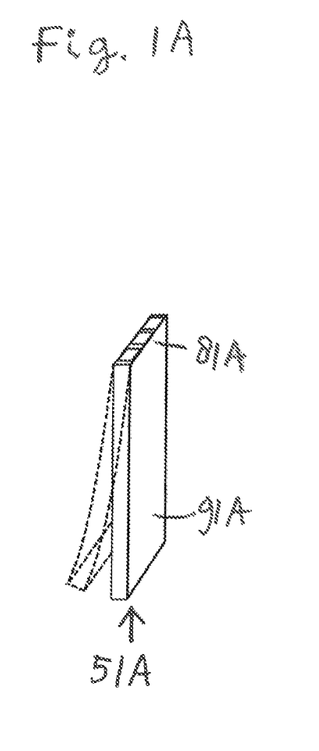
FIG. 1A shows in a perspective view an example of a first piezoelectric bending plate.
Figure 1B:
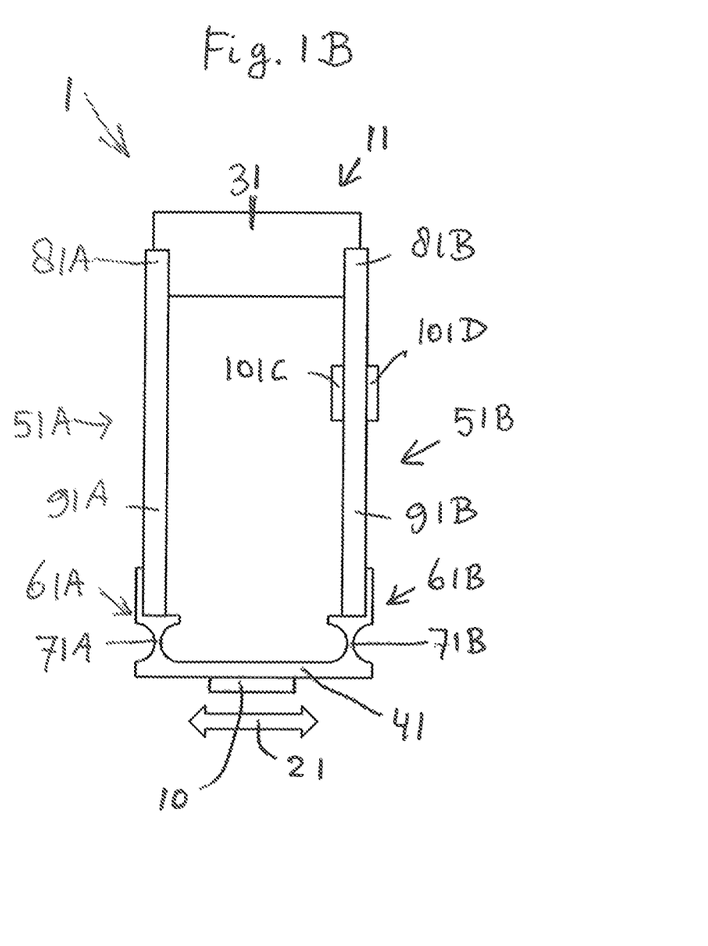
FIG. 1B shows in a cross-sectional view an example of an embodiment of a high-precision scanning device according to the invention, wherein the high-precision scanning device comprises the first piezoelectric bending plate of FIG. 1A.
Figure 2:
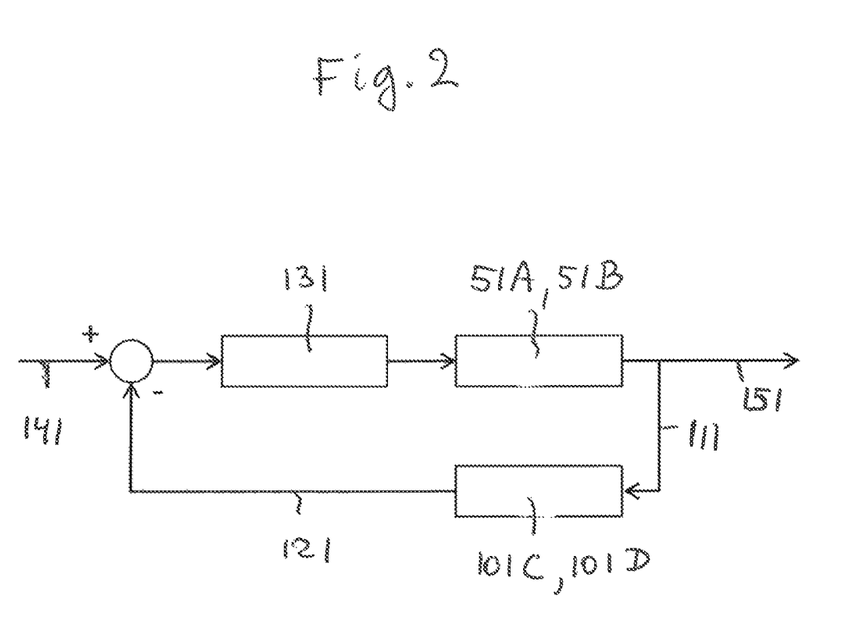
FIG. 2 shows a control-technology scheme for the abovementioned feedback control of the synchronic piezoelectric operation of the two first piezoelectric bending plates of the high-precision scanning device of FIG. 1B.

1; 1001 high-precision scanning device
10; 1010 working device
11; 1011 first linear scanner
21; 1021 first linear scanning axis
31; 1031 first base frame
41; 1041 first scanning frame
51A, 51B; 1051A, 1051B first piezoelectric bending plates
61A, 61B; 1061A, 1061B first hinge joints
71A, 71B; 1071A, 1071B first hinge axess
81A, 81B; 1081A, 1081B first immovable plate portions
91A, 91B; 1091A, 1091B first moveable plate portions
101C, 101D; 1101C, 1101D first sensors
111; 1111 first real-time condition
121; 1121 first real-time position
131; 1131 first feedback controller
141; 1141 first imposed position
151, 1151 first actual position
1012 second linear scanner
1022 second linear scanning axis
1032 second base frame
1042 second scanning frame
1052A, 1052B second piezoelectric bending plates
1062A, 1062B second hinge joints
1072A, 1072B second hinge axes
1082A, 1082B second immovable plate portions 1092A, 1092B second moveable plate portions
1102C, 1102D second sensors
1112 second real-time condition
1122 second real-time position
1132 second feedback controller
1142 second imposed position
1152 second actual position
1160 electrical connector
1170 glue application through-hole
1180 recessed attachment surface
1190 deeper recessed surface Reference is first made to FIGS. 1-2, which relate to the high-precision scanning device 1 according to the invention. This scanning device 1 is a scanning device according to each one of the attached claims 1 and 2.

FIG. 1A shows the first piezoelectric bending plate 51A of the first linear scanner 11 of the scanning device 1 of FIG. 1B. In FIG. 1A the first piezoelectric bending plate 51A is shown in its unbent, straight condition (the shown full lines), as well as in a bent condition (the shown broken lines).

The other first piezoelectric bending plate 51B shown in FIG. 1B is identical to the bending plate 51A. The first immovable plate portions 81A and 81B of the bending plates 51A and 51B, respectively, are fixedly attached to the first base frame 31, for example by means of glueing. At edges of the plates 51A and 51B opposite to the edges where the plate portions 81A and 81B are fixedly attached to the first base frame 31, the first movable plate portions 91A and 91B of the bending plates 51A and 51B, respectively, are fixedly attached to the first hinge joints 61A and 61B, for example by means of glueing.

From FIGS. 1A, 1B it is readily apparent that under influence of synchronic piezoelectric operation of the two first piezoelectric bending plates 51A, 51B, the two first moveable plate portions 91A, 91B together with the first scanning frame 41 are being synchronically moved relative to the first base frame 31 along the first linear scanning axis 21, while at the same time the two first immovable plate portions 81A, 81B remain immoveably connected relative to the first base frame 31. During these synchronical movements the first scanning frame 41 is hinging relative to the bending plates 51A, 51B about the first hinging axes 71A, 71B of the first hinge joints 61A, 61B, respectively.

It is noted that in FIG. 1B the reference numeral 10 indicates a working device at the first scanning frame. This working device 10 (very schematically depicted) is used during scanning for performing specific tasks within the working areas of the first linear scanner 11.

It is further noted that in FIG. 1B the reference numerals 101C, 101D indicate strain gauges mounted to opposite sides of the first piezoelectric bending plate 51B. These strain gauges 101C, 101D provide the function of the abovementioned at least one first sensor for detecting first real-time conditions of the first linear scanner 11. The strain gauges 101C, 101D are also shown in the control-technology scheme of FIG. 2. The scheme of FIG. 2 is briefly elucidated as follows.

In FIG. 2 the reference numeral 141 refers to a first imposed position (i.e. a desired/required position, also called "set point") of the first scanning frame 41 along the first linear scanning axis 21. The reference numeral 151 in FIG. 2 refers to an actual position of the first scanning frame 41 along the first linear scanning axis 21. The aim of the scheme of FIG. 2 is that the actual position 151 is controlled to become equal to the imposed position 141 within allowable error margins. For that purpose, the strain gauges 101C, 101D are continuously detecting the first real-time conditions 111 from the bending condition of the bending plate 51B. From each first real-time condition 111, a first real-time position 121 of the first scanning frame 41 along said first linear scanning axis 21 is obtained each time. This real-time position 121 is compared with the imposed position 141. Based on this kind of comparisons the first feedback controller 131 continuously performs the feedback control of the synchronic piezoelectric operation of the two first piezoelectric bending plates 51A, 51B, in such manner that the actual positions 151 are controlled to follow the imposed positions 141 within allowable error margins.

It is noted that instead of or in addition to strain gauges, many various other types of the first sensors may be applied. Furthermore, instead of the control-technology scheme of FIG. 2 many various other types of schemes based on control-technology may be applied.

Reference is now made to FIGS. 3-6, which relate to the high-precision scanning device 1001 according to the invention. This scanning device 1001 is a scanning device according to each one of the attached claims 1 through 6.

The scanning device 1 of FIGS. 1-2 and the scanning device 1001 of FIGS. 3-6 have in common that each has a first linear scanner, indicated by the reference numerals 11 and 1011, respectively. In fact, all parts and aspects in FIGS. 3-6 in relation to the first linear scanner 1011 which are alike to the parts and aspects in FIGS. 1-2 in relation to the first linear scanner 11 have been indicated by the same reference numerals, but increased by the integer value 1000. For example, where the first linear scanning axis of the first linear scanner 11 of FIG. 1 has been indicated by 21, the first linear scanning axis of the first linear scanner 1011 of FIGS. 3-5 has been indicated by 21+1000=1021, and so forth. Furthermore, the first linear scanner 1011 and the second linear scanner 1012 of the scanning device 1001 of FIGS. 3-6 are highly alike as to their constructions and working. For this reason, all parts and aspects in FIGS. 3-6 in relation to the second linear scanner 1012 which are alike to the parts and aspects in FIGS. 3-6 in relation to the first linear scanner 1011 have been indicated by the same reference numerals, but increased by the integer value 1. For example, where the first linear scanning axis of the first linear scanner 1011 has been indicated by 1021, the second linear scanning axis of the second linear scanner 1012 has been indicated by 1021+1=1022, and so forth.

Based on the abovementioned systematic structure of the reference numerals, FIGS. 3-6 are for the greatest part readily self-explanatory when these figures are seen in combination with the abovementioned explanations of FIGS. 1-2. In addition to these readily apparent self-explanations, the following extra explanations are given.

Figure 3:
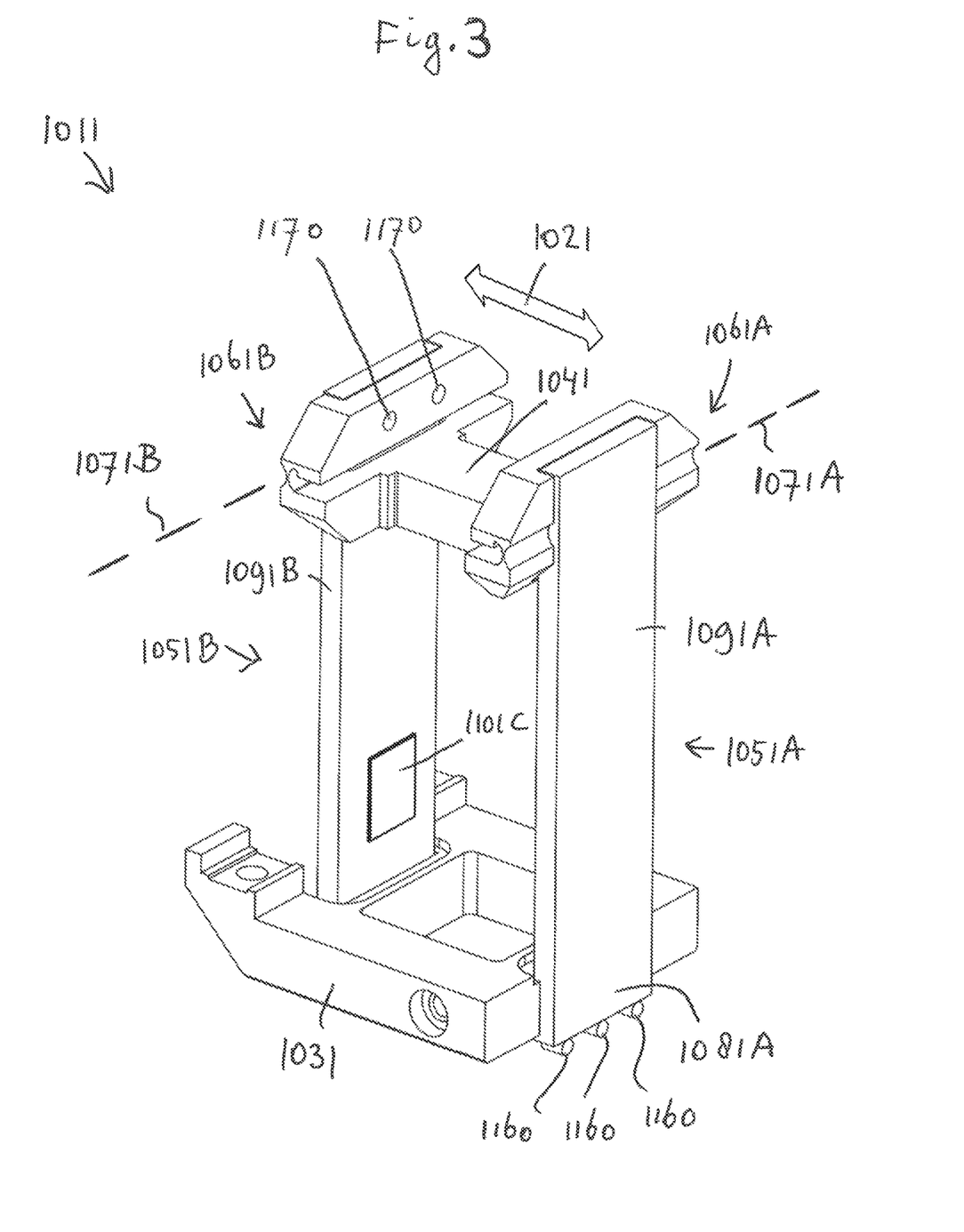
FIG. 3 shows in a perspective view a first linear scanner of an example of another embodiment of a high-precision scanning device according to the invention as shown in FIG. 5.
Figure 4:
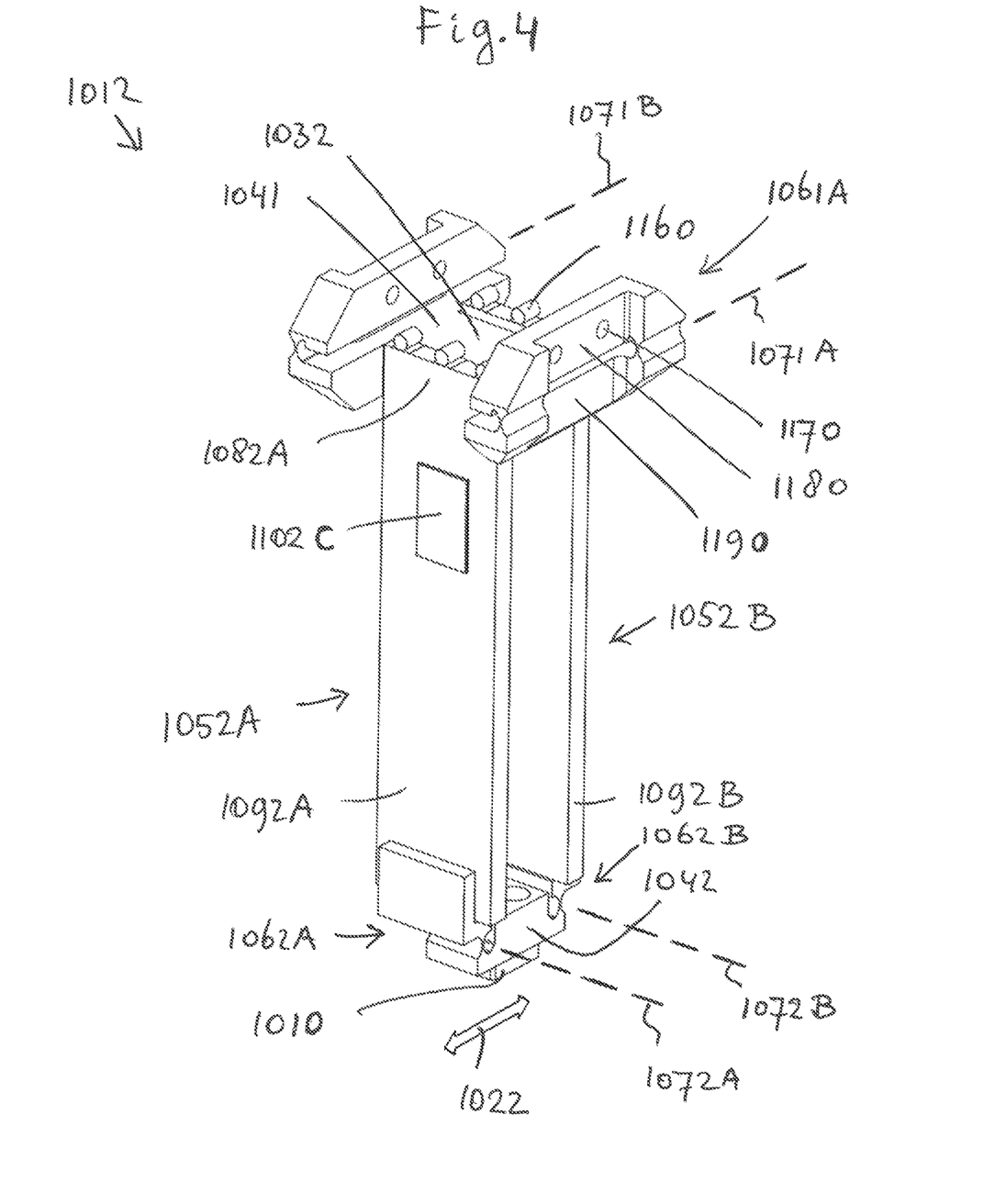
FIG. 4 shows, in the same perspective view as in FIG. 3, a second linear scanner of said high-precision scanning device shown in FIG. 5.
Figure 5:
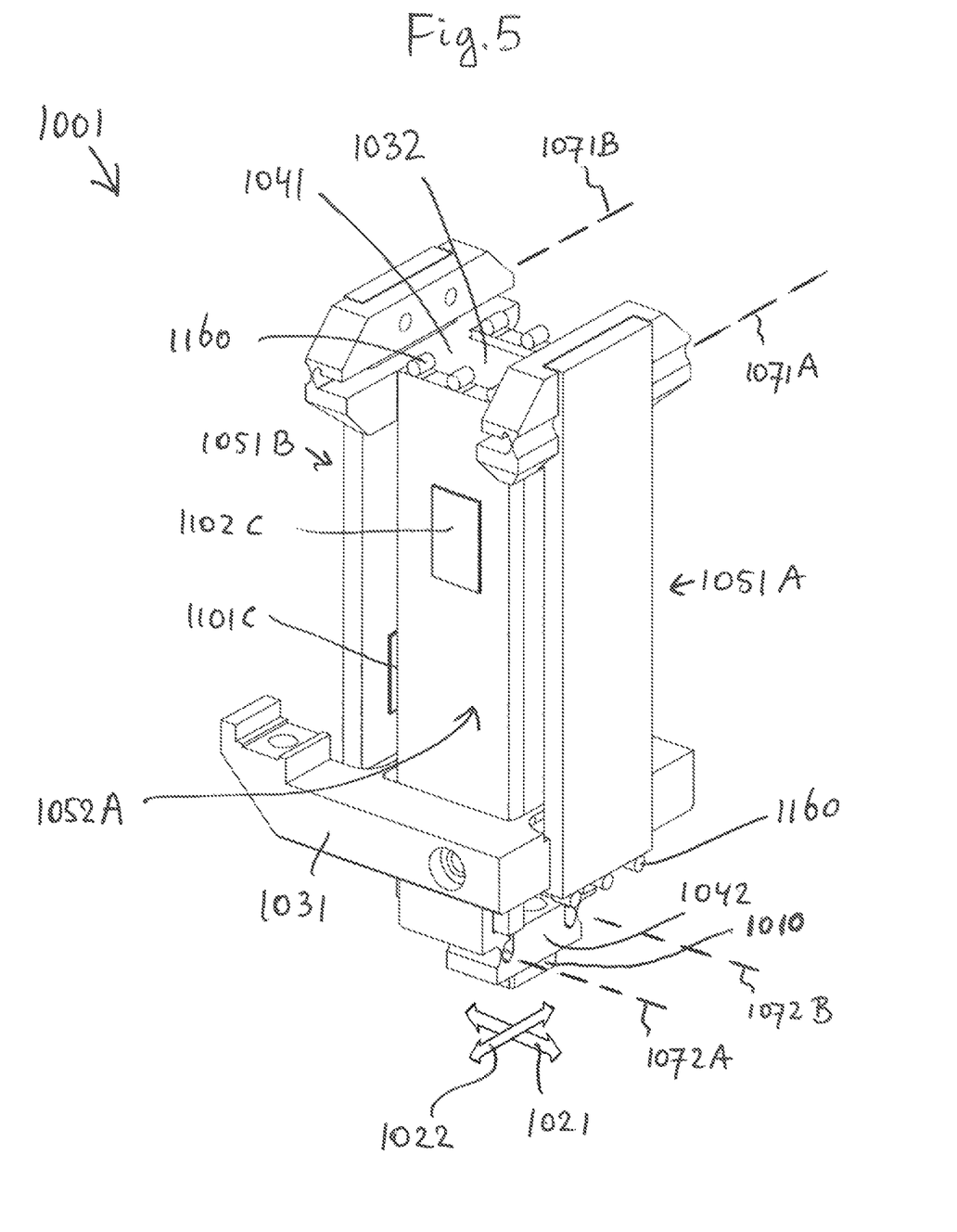
FIG. 5 shows, in said same perspective view, said high-precision scanning device, which includes the first linear scanner of FIG. 3 and the second linear scanner of FIG. 4.
Figure 6:
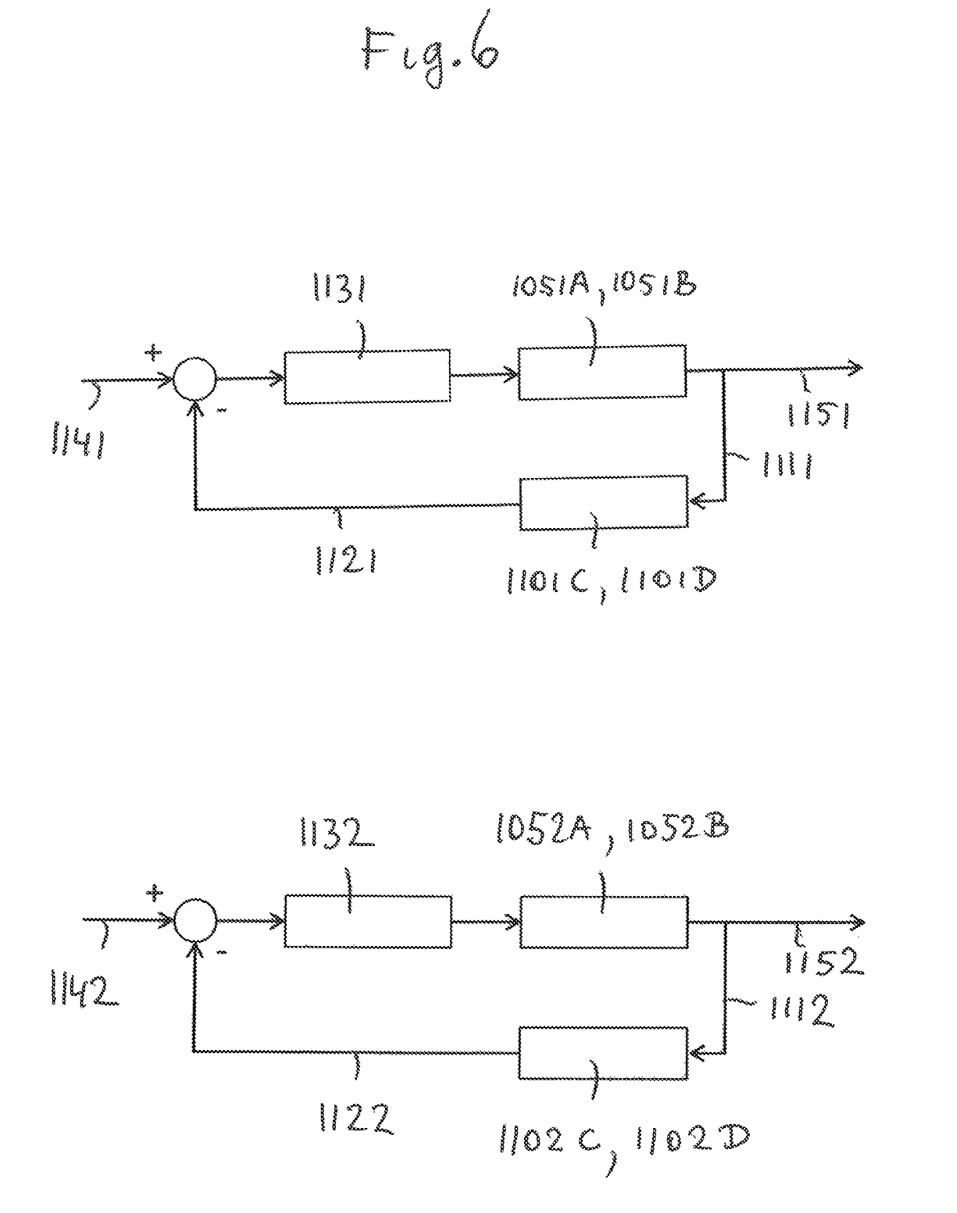
FIG. 6 shows a control-technology scheme for the abovementioned feedback control of the synchronic piezoelectric operation of the two first piezoelectric bending plates of the high-precision scanning device of FIG. 5, as well as a control-technology scheme for the abovementioned feedback control of the synchronic piezoelectric operation of the two second piezoelectric bending plates of the high-precision scanning device of FIG. 5.

In FIGS. 3-5, the elements indicated by the reference numeral 1160 are referring to electrical connectors for electrically connecting a piezoelectric bending plate concerned.

In FIGS. 3-5, the elements indicated by the reference numeral 1170 are referring to glue application through-holes. Via these through-holes 1170 glue has been applied for the fixed attachment of the first movable plate portions 1091A, 1091B to the first hinge joints 1061A, 1061B. It is noted that the attachment configuration of the movable plate portion 1091A to the first hinge joint 1061A and the attachment configuration of the movable plate portion 1091B to the first hinge joint 1061B are mutually symmetrical. More particularly, FIG. 4 shows the recessed attachment surface 1180 as well as the deeper recessed surface 1190 of the first hinge joint 1061A. The first movable plate portion 1091A is fixedly attached to the recessed attachment surface 1180, but it is not attached to the deeper recessed surface 1190. The fact that the deeper recessed surface 1190 is deeper recessed than the recessed attachment surface 1180 means that there is an interspace in-between the movable plate portion 1091A and the deeper recessed surface 1190. This interspace allows space for the synchronical hinging movements of the first scanning frame 1041 relative to the bending plates 1051A, 1051B about the first hinging axes 1071A, 1071B of the first hinge joints 1061A, 1061B, respectively.

It is noted that in the shown example the reference numerals 1041 and 1032 in FIGS. 4 and 5 are referring to one and the same element. The reason is that the last mentioned element not only functions as the first scanning frame 1041 of the first linear scanner 1011 (separately shown in FIG. 3), but also as the second base frame 1032 of the second linear scanner 1012 (separately shown in FIG. 4).

From FIG. 5 it is clearly seen that the high-precision scanning device with its first and second linear scanners can be designed with a very high overall compactness, which further improves the accessibility of the high-precision scanning device to very tiny working areas where the precise two-dimensional scanning movements have to be performed.

The invention claimed is:

1. A high-precision scanning device comprising:
a first linear scanner for providing scanning movements along a first linear scanning axis, wherein said first linear scanner comprises a first base frame, a first scanning frame, two mutually parallel first piezoelectric bending plates, and two first hinge joints having two mutually parallel first hinge axes, respectively,
and wherein:
said first linear scanning axis is orthogonal to said first piezoelectric bending plates as seen in unbent, straight conditions of said first piezoelectric bending plates;
said two mutually parallel first hinge axes are parallel to local bending axes about which said first piezoelectric bending plates are locally bending when piezoelectrically operated;
the two first piezoelectric bending plates have two mutually parallel first immovable plate portions respectively, which are immoveably connected relative to the first base frame;
the two first piezoelectric bending plates have two mutually parallel first moveable plate portions, respectively, which are moveable relative to the first base frame in accordance with said locally bending of said first piezoelectric bending plates;
the two first hinge joints are hingingly connecting the first scanning frame to the two first moveable plate portions, respectively, whereby the first scanning frame is forming a hingeable bridge between the two first piezoelectric bending plates;
under influence of synchronic piezoelectric operation of the two first piezoelectric bending plates, the two first moveable plate portions together with the first scanning frame are being synchronically moved relative to the first base frame along said first linear scanning axis, while at the same time the two first immovable plate portions remain immoveably connected relative to the first base frame.

2. A high-precision scanning device according to claim 1, further comprising:
at least one first sensor, which is configured, arranged and effective to detect first real-time conditions of the first linear scanner, wherein first real-time positions of the first scanning frame along said first linear scanning axis are obtainable from said detected first real-time conditions; and
at least one first feedback controller, which is configured, arranged and effective for feedback control of said synchronic piezoelectric operation of the two first piezoelectric bending plates for realizing first imposed positions of the first scanning frame along said first linear scanning axis based on said detected first real-time conditions.

3. A high-precision scanning device according to claim 1, further comprising:
a second linear scanner for providing scanning movements along a second linear scanning axis, wherein said second linear scanner comprises a second base frame, a second scanning frame, two mutually parallel second piezoelectric bending plates, and two second hinge joints having two mutually parallel second hinge axes, respectively,
and wherein:
said second linear scanning axis is orthogonal to said second piezoelectric bending plates as seen in unbent, straight conditions of said second piezoelectric bending plates;
said two mutually parallel second hinge axes are parallel to local bending axes about which said second piezoelectric bending plates are locally bending when piezoelectrically operated;
the two second piezoelectric bending plates have two mutually parallel second immovable plate portions, respectively, which are immoveably connected relative to the second base frame;
the two second piezoelectric bending plates have two mutually parallel second moveable plate portions, respectively, which are moveable relative to the second base frame in accordance with said locally bending of said second piezoelectric bending plates;
the two second hinge joints are hingingly connecting the second scanning frame to the two second moveable plate portions, respectively, whereby the second scanning frame is forming a hingeable bridge between the two second piezoelectric bending plates;
under influence of synchronic piezoelectric operation of the two second piezoelectric bending plates, the two second moveable plate portions together with the second scanning frame are being synchronically moved relative to the second base frame along said second linear scanning axis, while at the same time the two second immovable plate portions remain immoveably connected relative to the second base frame;
and wherein:
the first linear scanning axis and the second linear scanning axis are non-parallel relative to one another;
the two mutually parallel second immovable plate portions are immoveably connected relative to the first scanning frame.

4. A high-precision scanning device according to claim 3, wherein the first linear scanning axis and the second linear scanning axis are orthogonal relative to one another.

5. A high-precision scanning device according to claim 3, wherein, as seen along a third axis which is orthogonal to both the first linear scanning axis and the second linear scanning axis, a first direction facing from the first base frame towards the first scanning frame is opposite to a second direction facing from the second base frame towards the second scanning frame.

6. A high-precision scanning device according to claim 3, further comprising:
- at least one second sensor, which is configured, arranged and effective to detect second real-time conditions of the second linear scanner, wherein second real-time positions of the second scanning frame along said second linear scanning axis are obtainable from said detected second real-time conditions; and
- at least one second feedback controller, which is configured, arranged and effective for feedback control of said synchronic piezoelectric operation of the two second piezoelectric bending plates for realizing second imposed positions of the second scanning frame along said second linear scanning axis based on said detected second real-time conditions.

* * * * *